(12) United States Patent
Schmit et al.

(10) Patent No.: US 9,450,609 B1
(45) Date of Patent: Sep. 20, 2016

(54) METHODS AND APPARATUS FOR EMBEDDING AN ERROR CORRECTION CODE IN MEMORY CELLS

(71) Applicant: Altera Corporation, San Jose, CA (US)

(72) Inventors: Herman Henry Schmit, Palo Alto, CA (US); Michael David Hutton, Mountain View, CA (US)

(73) Assignee: Altera Corporation, San Jose, CA (US)

( * ) Notice: Subject to any disclaimer, the term of this patent is extended or adjusted under 35 U.S.C. 154(b) by 5 days.

(21) Appl. No.: 14/675,294

(22) Filed: Mar. 31, 2015

(51) Int. Cl.
| | |
|---|---|
| *G06F 11/00* | (2006.01) |
| *G11C 29/00* | (2006.01) |
| *H03M 13/05* | (2006.01) |
| *G06F 11/07* | (2006.01) |
| *G06F 11/10* | (2006.01) |

(52) U.S. Cl.
CPC .......... *H03M 13/05* (2013.01); *G06F 11/0787* (2013.01); *G06F 11/1044* (2013.01)

(58) Field of Classification Search
CPC .......... G06F 11/0787; G06F 11/1044; H03M 13/05; H03M 13/09; G11C 15/00; G11C 15/04
USPC ...... 714/800, 766, 763, 769, 752, 758, 6.24; 365/49.1, 200, 201
See application file for complete search history.

(56) References Cited

U.S. PATENT DOCUMENTS

| | | | |
|---|---|---|---|
| 6,373,739 B1 * | 4/2002 | Lien ....................... | G11C 15/04 365/168 |
| 7,219,325 B1 | 5/2007 | Lysaght | |
| 7,328,377 B1 | 2/2008 | Lewis et al. | |
| 7,464,241 B2 * | 12/2008 | Vogt ......................... | G11C 5/04 711/111 |
| 7,724,567 B2 * | 5/2010 | Dhong ................. | G06F 12/0864 365/174 |
| 8,112,678 B1 | 2/2012 | Lewis et al. | |
| 2006/0062038 A1 * | 3/2006 | Kang ...................... | G11C 15/00 365/49.17 |
| 2012/0239368 A1 | 9/2012 | Agmon | |

FOREIGN PATENT DOCUMENTS

WO    2012047735    4/2012

OTHER PUBLICATIONS

McMurchie et al., "PathFinder: A Negotiation-Based Performance-Driven Router for FPGAs" Field-Programmable Gate Arrays, 1995, ACM Symposium on FPGAs.

(Continued)

*Primary Examiner* — Christine Tu

(57) ABSTRACT

A computer-aided design (CAD) tool may identify don't care bits in configuration data. The don't care bits in the configuration data may change polarity without affecting the functionality of the circuit design. The CAD tool may compute an error check code (e.g., parity bits for a two-dimensional parity check) and insert the error check code into the configuration data. As an example, the CAD tool may replace don't care bits in the configuration data with the error code. The configuration data may be stored in configuration memory cells on a programmable integrated circuit, thereby implementing the circuit design with the error code on the programmable integrated circuit. During execution, the programmable integrated circuit may execute error checking and detect and correct errors in the configuration data based on the embedded error code.

25 Claims, 13 Drawing Sheets

(56) References Cited

OTHER PUBLICATIONS

Betz et al., "Architecture and CAD for Deep-Submission FPGAs", The Kluwer International Series in Engineering and Computer Science, 1999.

Betz et al., "VPR: A New Packing, Placement and Routing Tool for FPGA Research" 1997 International Workshop on Field Programmable Logic and Applications, Retrieved from the Internet<URL:http://www.eecg.toronto.edu/~vaughn/papers/fpl97.pdf> [Retrieved on Mar. 31, 2015].

* cited by examiner

METHODS AND APPARATUS FOR EMBEDDING AN ERROR CORRECTION CODE IN MEMORY CELLS

BACKGROUND

This invention relates to memory bit corruption and, more particularly, to detecting and correcting memory bit corruption in integrated circuits.

Contemporary integrated circuits often contain memory elements. In some arrangements, memory elements are used to store configuration data in integrated circuits. For example, memory elements may be used to store configuration data in programmable integrated circuits. A programmable integrated circuit is a general-purpose integrated circuit that can be at least partially customized to implement a desired circuit design (e.g., by loading predetermined configuration data into the memory elements).

Integrated circuits are subject to a phenomenon known as single event upset (SEU). A single event upset is a change of state caused by ions or electro-magnetic radiation. An upset event in a memory element that stores a configuration data bit can have serious repercussions. For example, a look-up table (LUT) may implement a different logic function or a routing multiplexer may enable a bad connection.

It is within this context that the embodiments herein arise.

SUMMARY

In accordance with certain aspects of the invention, a computer-aided design (CAD) tool may be used for processing configuration data that is stored in configuration memory cells on a programmable integrated circuit and for implementing a circuit design on the programmable integrated circuit. For example, the CAD tool may identify a don't care subset of the configuration memory cells that store don't care bits of the configuration data such that a polarity change in one of the don't care bits preserves the functionality of the circuit design implementation in the programmable integrated circuit. The CAD tool may further compute a first parity bit of a first subset of the configuration data stored in a first subset of the configuration memory cells and store the first parity bit in a first configuration memory cell in the don't care subset of configuration memory cells.

It is appreciated that the present invention can be implemented in numerous ways, such as a process, an apparatus, a system, a device, or instructions on a computer readable medium. Several inventive embodiments of the present invention are described below.

In certain embodiments, the above-mentioned CAD tool may compute a second parity bit of a second subset of configuration data stored in a second subset of the configuration memory cells. The first and second subsets of the configuration memory cells may overlap in a common predetermined configuration memory cell. The second parity bit may be stored in a second configuration memory cell of the don't care subset of configuration memory cells. In some embodiments, the CAD tool may associate a first location with the first configuration memory cell and select a second location for the second configuration memory cell that has a predetermined distance from the first location.

If desired, the CAD tool may compute a third parity bit of the first subset of configuration data stored in the first subset of configuration memory cells and detect a mismatch between the first and third parity bits that is indicative of an error in the first subset of configuration data by comparing the first and third parity bits. The CAD tool may further compute a fourth parity bit of the second subset of configuration data stored in the second subset of configuration memory cells and detect a mismatch between the second and fourth parity bits that is indicative of an error in the second subset of configuration data by comparing the second and fourth parity bits.

Further features of the invention, its nature and various advantages, will be more apparent from the accompanying drawings and the following detailed description of the preferred embodiments.

DETAILED DESCRIPTION

The present invention relates to memory bit corruption and, more particularly, to detecting and correcting memory bit corruption in integrated circuits (ICs).

Integrated circuits such as programmable integrated circuits are subject to a phenomenon known as single event upset (SEU). A single event upset is a change of state caused by ions or electro-magnetic radiation. Cosmic rays or radioactive impurities embedded in integrated circuits and their packages may be responsible for generating such ions or electro-magnetic radiation.

When ions or electro-magnetic radiation strike the silicon substrate on which the integrated circuit is implemented, electron-hole pairs are generated. The electron-hole pairs create a conduction path that can cause a charged node (e.g., a memory element) to discharge. Thus, a single event upset may cause a change in the memory element from logic "1" to logic "0".

Upset events in sequential elements (e.g., memory elements, latches, or registers) can have serious repercussions. For example, a memory array may store erroneous data, a look-up table (LUT) may implement a different logic function, or a programmable routing multiplexer may enable a bad connection.

Various error detection techniques have been developed in modern integrated circuits to address this issue. Some error detection techniques involve implementing multiple instances of the same circuitry and performing a majority vote on the output of those multiple instances. These error detection techniques are fast and effective, but require a large amount of additional hardware resources. Other error detection techniques involve checking the state of the sequential elements in their original state, and restoring the original state if a memory bit has been corrupted. However, these error detection techniques are not applied instantaneously, and therefore there is a risk that a corrupted design operates in a corrupted state for at least some duration of time.

It may therefore be desirable to reduce the duration of time that is needed to detect and/or correct a corrupted memory bit in an integrated circuit using a minimal amount of additional hardware resources. For example, it may be desirable to reduce the error detection time, the error correction time, or both with minimal overhead in additional resources.

It will be recognized by one skilled in the art that the present exemplary embodiments may be practiced without some or all of these specific details. In other instances, well-known operations have not been described in detail in order not to unnecessarily obscure the present embodiments.

Figure 1:
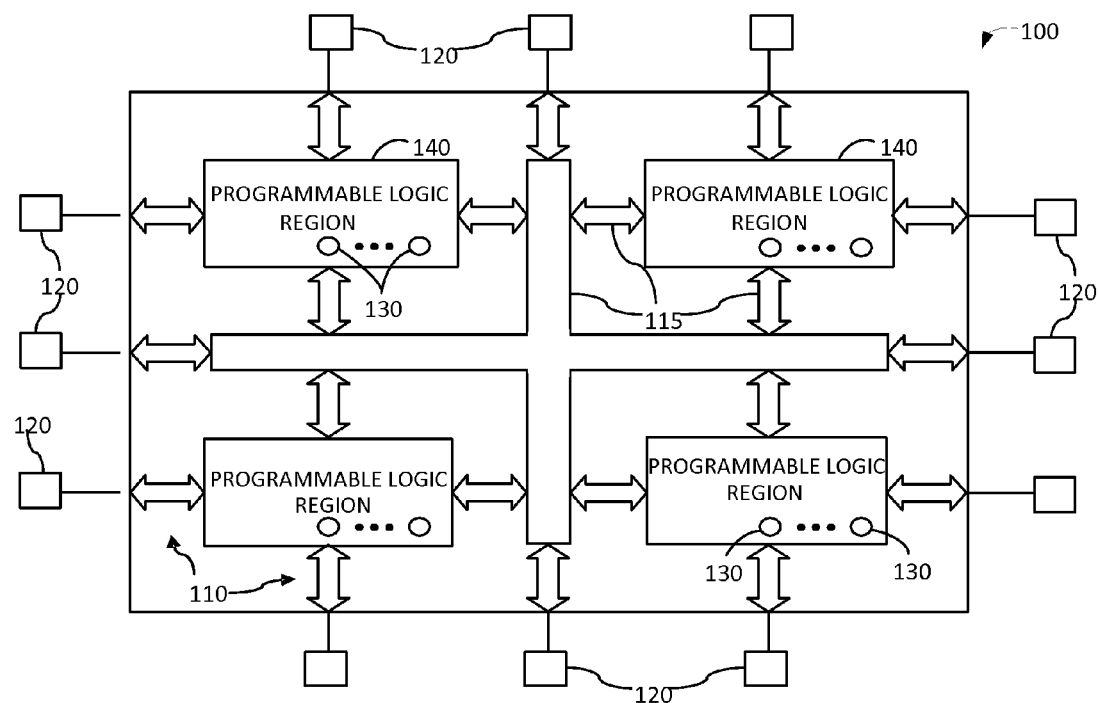
FIG. 1 is a diagram of an illustrative integrated circuit with memory elements in accordance with an embodiment.

An illustrative embodiment of an integrated circuit such as a programmable logic device (PLD) 100 in accordance with an embodiment is shown in FIG. 1.

Programmable logic device 100 has input/output circuitry 110 for driving signals off of device 100 and for receiving signals from other devices via input/output pins 120. Interconnection resources 115 such as global and local vertical and horizontal conductive lines and buses may be used to route signals on device 100.

Input/output circuitry 110 include external interface circuits, serial data transceiver circuitry, differential receiver and transmitter circuitry, or other circuitry used to connect one integrated circuit to another integrated circuit.

Interconnection resources 115 include conductive lines and programmable connections between respective conductive lines and are therefore sometimes referred to as programmable interconnects.

Programmable logic region 140 may include programmable components such as digital signal processing circuitry, storage circuitry, arithmetic circuitry, or other combinational and/or sequential logic circuitry such as configurable register circuitry.

The programmable logic region 140 may be configured to perform a custom logic function. The programmable logic region 140 may also include specialized blocks that perform a given application and have limited configurability. For example, the programmable logic region 140 may include specialized blocks such as configurable storage blocks, configurable processing blocks, programmable phase-locked loop circuitry, programmable delay-locked loop circuitry, or other specialized blocks with limited configurability. The programmable interconnects 115 may also be considered to be a type of programmable logic region 140.

The circuitry of device 100 may be organized using any suitable architecture. As an example, the logic of programmable logic device 100 may be organized in a series of rows and columns of larger programmable logic regions each of which contains multiple smaller logic regions. The smaller regions may be, for example, regions of logic that are sometimes referred to as logic elements (LEs), each containing one or more look-up tables, one or more registers, and programmable multiplexer circuitry. The smaller regions may also be, for example, regions of logic that are sometimes referred to as adaptive logic modules (ALMs), configurable logic blocks (CLBs), slice, half-slice, etc. If desired, an adaptive logic module may include adder circuitry, one or more registers, and a look-up table or other block of shared combinational logic (i.e., resources from a pair of LEs—sometimes referred to as adaptive logic elements or ALEs in this context). The larger regions may be, for example, logic array blocks (LABs) or logic clusters of regions of logic containing for example multiple logic elements or multiple ALMs.

Programmable logic device 100 may contain programmable memory elements 130. Programmable memory elements 130 may use any suitable volatile and/or non-volatile memory structures such as random-access-memory (RAM) cells, fuses, antifuses, programmable read-only-memory cells, mask-programmed and laser-programmed structures, combinations of these structures, etc. Because programmable memory elements 130 are loaded with configuration data during programming, programmable memory elements 130 are sometimes referred to as configuration memory, configuration RAM (CRAM), configuration memory cells, configuration memory bits, or memory elements.

Memory elements 130 can be loaded with configuration data (also called programming data) using pins 120 and input/output circuitry 110. Once loaded, the memory elements each provide a corresponding static control signal that controls the operation of an associated logic component in programmable logic region 140. In a typical scenario, the outputs of the loaded memory elements 130 are applied to the gates of transistors in programmable logic region 140 to turn certain transistors on or off and thereby configure the logic in programmable logic region 140 and routing paths. Programmable logic circuit elements that may be controlled in this way include parts of multiplexers (e.g., multiplexers used for forming routing paths in programmable interconnects 115), look-up tables, logic arrays, AND, OR, NAND, and NOR logic gates, pass gates, etc.

The configuration data that is loaded into memory elements 130 may be associated with a circuit design, and loading the configuration data into memory elements 130 may implement the circuit design in the programmable logic device 100. Some bits of the configuration data may be don't care bits for the circuit design implementation. A don't care bit may be a bit stored in a memory element 130 that does not change the behavior of the circuit design implementation when the value of that bit changes. A memory element that stores a don't care bit is sometimes also referred to as a don't care memory element.

For example, consider the scenario in which the configuration data of a circuit design implementation stores logic "1" in one of the memory elements 130. If changing the state of this memory element 130 from logic "1" to logic "0" preserves the functionality of the circuit design implementation then the bit of the configuration data that is stored in this memory element 130 is a don't care bit of the configuration data for this circuit design implementation.

As another example, consider the scenario in which the configuration data of a circuit design implementation stores logic "0" in one of the memory elements 130. If changing the state of this memory element 130 from logic "0" to logic "1" preserves the functionality of the circuit design implementation then the bit of the configuration data that is stored in this memory element 130 is a don't care bit of the configuration data for this circuit design implementation.

Figure 2:
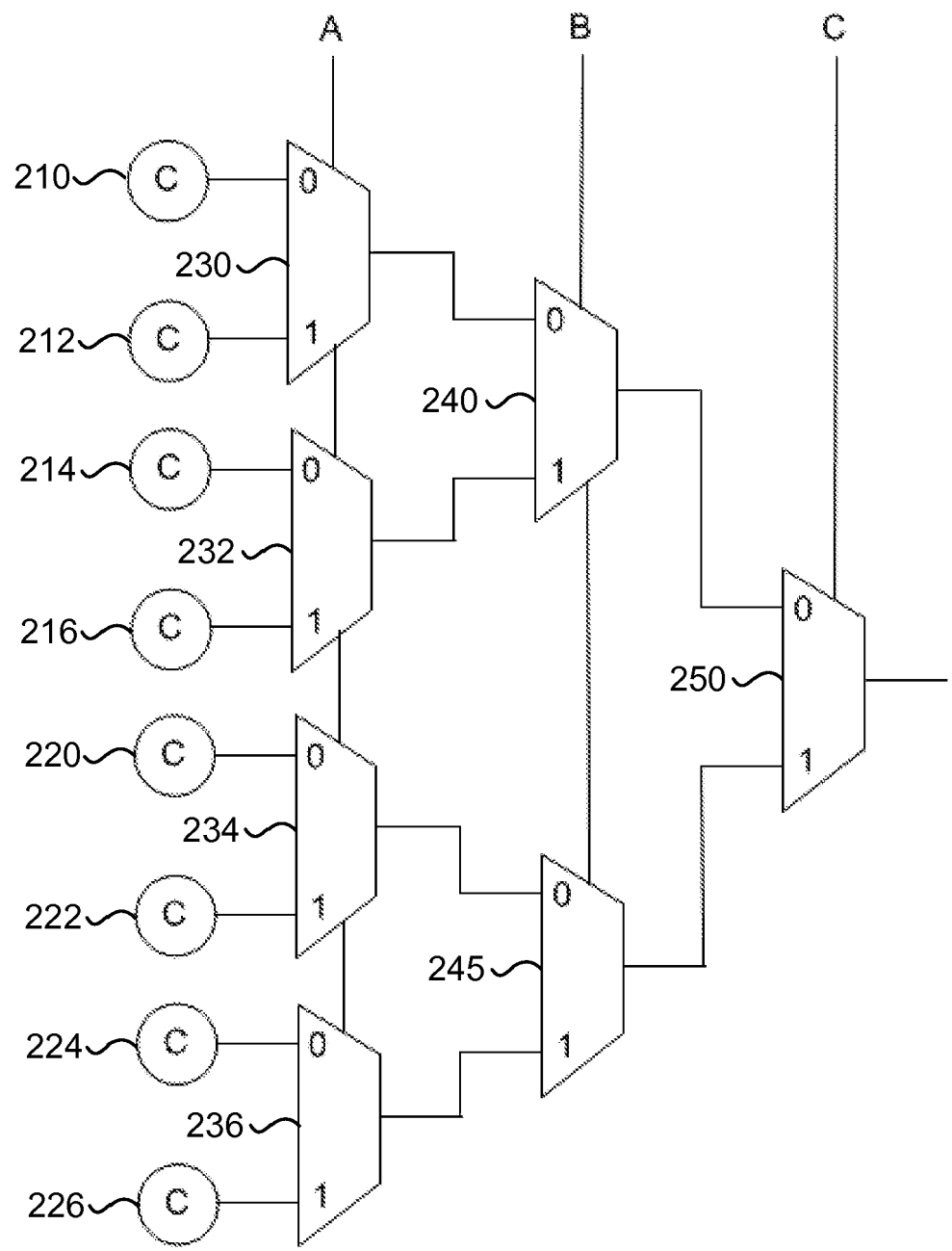
FIG. 2 is a diagram of an illustrative three-input look-up table (LUT) with configuration memory cells in accordance with an embodiment.

FIG. 2 is a diagram of an illustrative look-up table (LUT) with configuration memory cells. The look-up table may have inputs A, B, and C, multiplexer 250 that is controlled by input C, multiplexers 240 and 245 that are controlled by input B, multiplexers 230, 232, 234, and 236 that are controlled by input C, and configuration memory cells 210, 212, 214, 216, 220, 222, 224, and 226. The look-up table may be configured to implement any logic function with up to three inputs by programming the configuration memory cells.

For example, programming configuration memory cell 226 with a bit that is logic "1" and all other configuration memory cells 210 to 224 with bits that are logic "0" may implement the logic AND function of A, B, and C. As another example, programming configuration memory cell 210 with a bit that is logic "0" and all other configuration memory cells 212 to 226 with bits that are logic "1" may implement the logic OR function of A, B, and C.

Consider the scenario in which the look-up table is configured to implement a logic AND function of B and C. In this scenario, configuration memory cells 224 and 226 may store bits that are logic "1" and all other configuration memory cells 210 to 222 store bits that are logic "0" to implement the logic AND function of B and C. In another scenario, input A may be tied to logic "0". In this other scenario, configuration memory cell 224 may store a bit that is logic "1" and configuration memory cells 210, 214, and 220 may store bits that are logic "0" to implement the logic AND function of B and C, whereas configuration memory cells 212, 216, 222, and 226 store don't care bits. In other words, the look-up table implements the logic AND function of B and C independent of whether configuration memory cells 212, 216, 222, and 226, respectively store a bit that is logic "0" or a bit that is logic "1" as long as input A is tied to logic "0".

In the event that the look-up table is unused (e.g., a circuit design implementation uses only a portion of available look-up tables on an integrated circuit), then all configuration memory cells 210 to 226 store don't care bits. In this event, any programmable routing multiplexer on the input of the look-up table may also store don't care bits. Such a programmable routing multiplexer is sometimes also referred to as a routing multiplexer circuit, a configurable routing multiplexer, or a routing multiplexer.

Figure 3A:
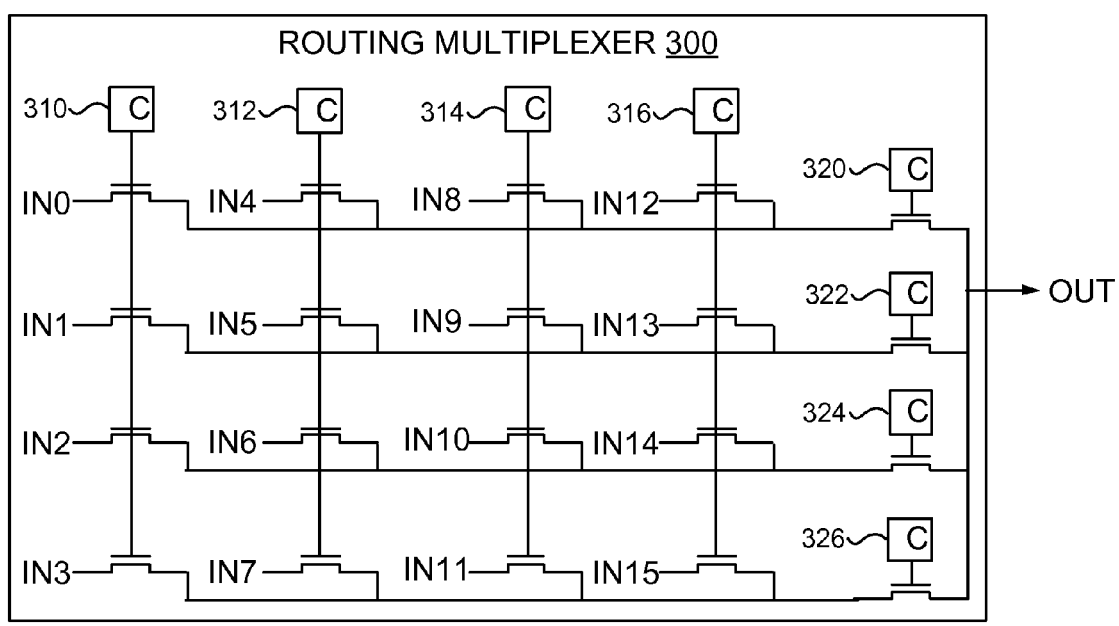
FIG. 3A is a diagram of an illustrative routing multiplexer circuit with configuration memory cells in accordance with an embodiment.

FIG. 3A shows a diagram of an illustrative routing multiplexer circuit with configuration memory cells in accordance with an embodiment. As shown, routing multiplexer 300 may include configuration memory cells 310, 312, 314, 316, 320, 322, 324, and 326. The configuration memory cells may be programmed to route a signal on any one of inputs IN0 to IN15 to output OUT. For example, programming configuration memory cells 310 and 320 with a bit that is logic "1" and configuration memory cells 312, 314, 316, 322, 324, and 326 with bits that are logic "0" conductively couples input IN0 to output OUT, thereby routing a signal on input IN0 to output OUT.

Consider the scenario in which routing multiplexer 300 is unused (e.g., signal OUT is coupled to an unused look-up table). In this scenario, configuration memory cells 310, 312, 314, and 316 may store bits that are logic "0", thereby decoupling all inputs IN0 to IN15. Thus, configuration memory cells 320, 322, 324, and 326 may store don't care bits. In other words, all inputs IN0 to IN15 are decoupled from output OUT independent of the bit values stored in configuration memory cells 320, 322, 324, and 326 as long as configuration memory cells 310, 312, 314, and 316 store a bit that is logic "0".

Figure 3B:
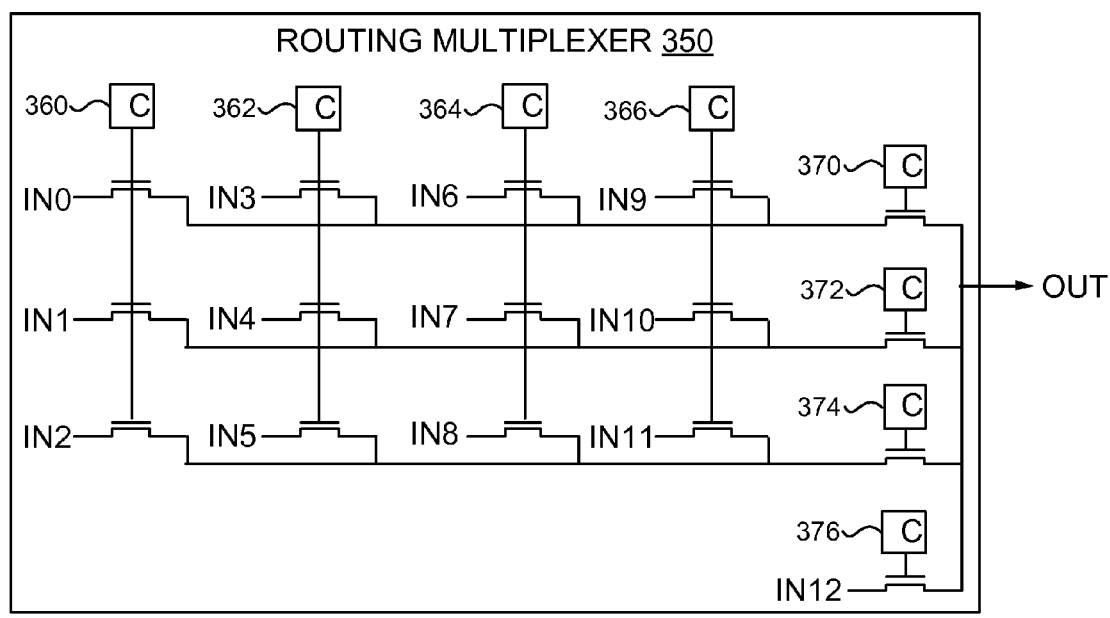
FIG. 3B is a diagram of an illustrative routing multiplexer circuit with configuration memory cells and a fast input in accordance with an embodiment.

Routing multiplexer 300 may have two pass transistors coupled between any input and the output. In some embodiments, a routing multiplexer may have one or more inputs with only one pass transistor coupled between the respective input and the output. An embodiment of such a routing multiplexer is shown in FIG. 3B.

As shown, routing multiplexer 350 may include configuration memory cells 360, 362, 364, 366, 370, 372, 374, and 376. The paths from inputs IN0 to IN11, respectively to output OUT may have two pass transistors and the path from input IN12 to output OUT may have only one pass transistor. Thus, a signal arriving at input IN12 may propagate in less time to output OUT than a signal arriving at inputs IN1 to IN11. In other words, the propagation delay from input IN12 to output OUT may be shorter than the propagation delay from inputs IN1, IN2, . . . , IN11 to output OUT. Therefore, input IN12 is sometimes also referred to as a "fast input" to routing multiplexer 350.

The configuration memory cells may be programmed to route a signal on any one of inputs IN0 to IN12 to output OUT. For example, programming configuration memory cells 360 and 370 with a bit that is logic "1" and configuration memory cells 362, 364, 366, 372, 374, and 376 with bits that are logic "0" conductively couples input IN0 to output OUT, thereby routing a signal from input IN0 to output OUT.

As another example, programming configuration memory cell 376 with a bit that is logic "1" and configuration memory cells 370, 372, and 374 with bits that are logic "0" conductively couples input IN12 to output OUT, thereby routing a signal from input IN12 to output OUT. In this example, configuration memory cells 360, 362, 364, and 366 may store don't care bits. In other words, all inputs IN0 to IN11 are decoupled from output OUT independent of the bit values stored in configuration memory cells 360, 362, 364, and 366 as long as configuration memory cells 370, 372, and 374 store a bit that is logic "0".

Figure 4:
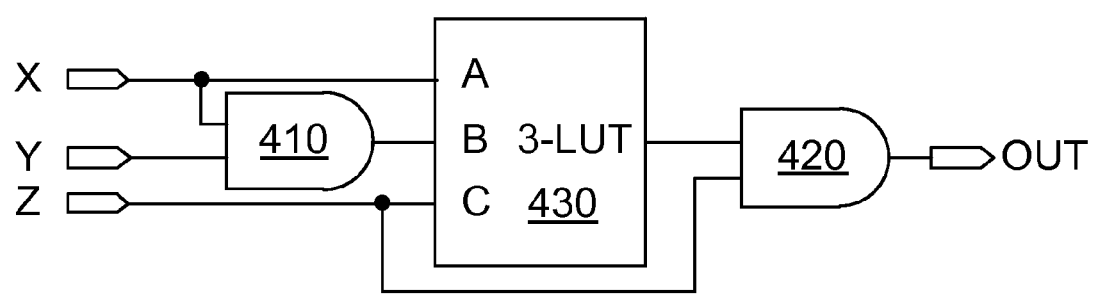
FIG. 4 is a diagram of an illustrative combinational logic circuit with don't care bits in accordance with an embodiment.

Even in the event that the look-up table of FIG. 2 is used and all inputs are connected, some configuration memory cells 210 to 226 may store don't care bits based on the connectivity of the look-up table. FIG. 4 is a diagram of an illustrative combinational logic circuit with a three-input look-up table that stores don't care bits in accordance with an embodiment.

As shown, the combinational circuit may include three-input look-up table (3-LUT) 430, logic AND gates 410 and 420, output OUT, and inputs X, Y, and Z. Input X may be coupled to input A of 3-LUT 430 and to one of the inputs of logic AND gate 410. Since the output of logic AND gate 410 is coupled to input B of 3-LUT 430, input B may not receive a signal that is logic "1" when input A receives a signal that is logic "0". This input combination of 3-LUT inputs A and B is sometimes also referred to as a satisfiability don't care for the 3-LUT. Thus, in the event that 3-LUT 430 includes the look-up table of FIG. 2, configuration memory cells 214 and 224 may store don't care bits.

Consider the scenario in which 3-LUT 430 implements the logic function ((A AND B) OR NOT C). Since input Z is coupled to input C of 3-LUT 430 and to the input of logic AND gate 420, output OUT may implement the logic function (((A AND B) OR NOT C) AND C) which reduces to (A AND B). In other words, the output OUT is independent of input C to 3-LUT 430. In this scenario, input C of 3-LUT 430 is sometimes also referred to as an observability don't care. Therefore, input C of 3-LUT 430 may be decoupled from input Z and set to a constant value (e.g., to logic "1"). In the event that 3-LUT 430 includes the look-up table of FIG. 2 and input C of 3-LUT 430 is coupled to logic "1", configuration memory cells 210, 212, 214, and 216 may store don't care bits. In the event that 3-LUT 430 includes the look-up table of FIG. 2 and input C of 3-LUT 430 is coupled to logic "0", configuration memory cells 220, 222, 224, and 226 may store don't care bits.

CAD tools in a circuit design system may determine don't care bits associated with satisfiability don't cares and observability don't cares in a circuit design (e.g., as illustrated in FIG. 4). If desired, CAD tools may also reserve bits as don't care bits or set selected bits to predetermined values (e.g., as illustrated in FIGS. 2, 3A, and 3B).

Figure 5:
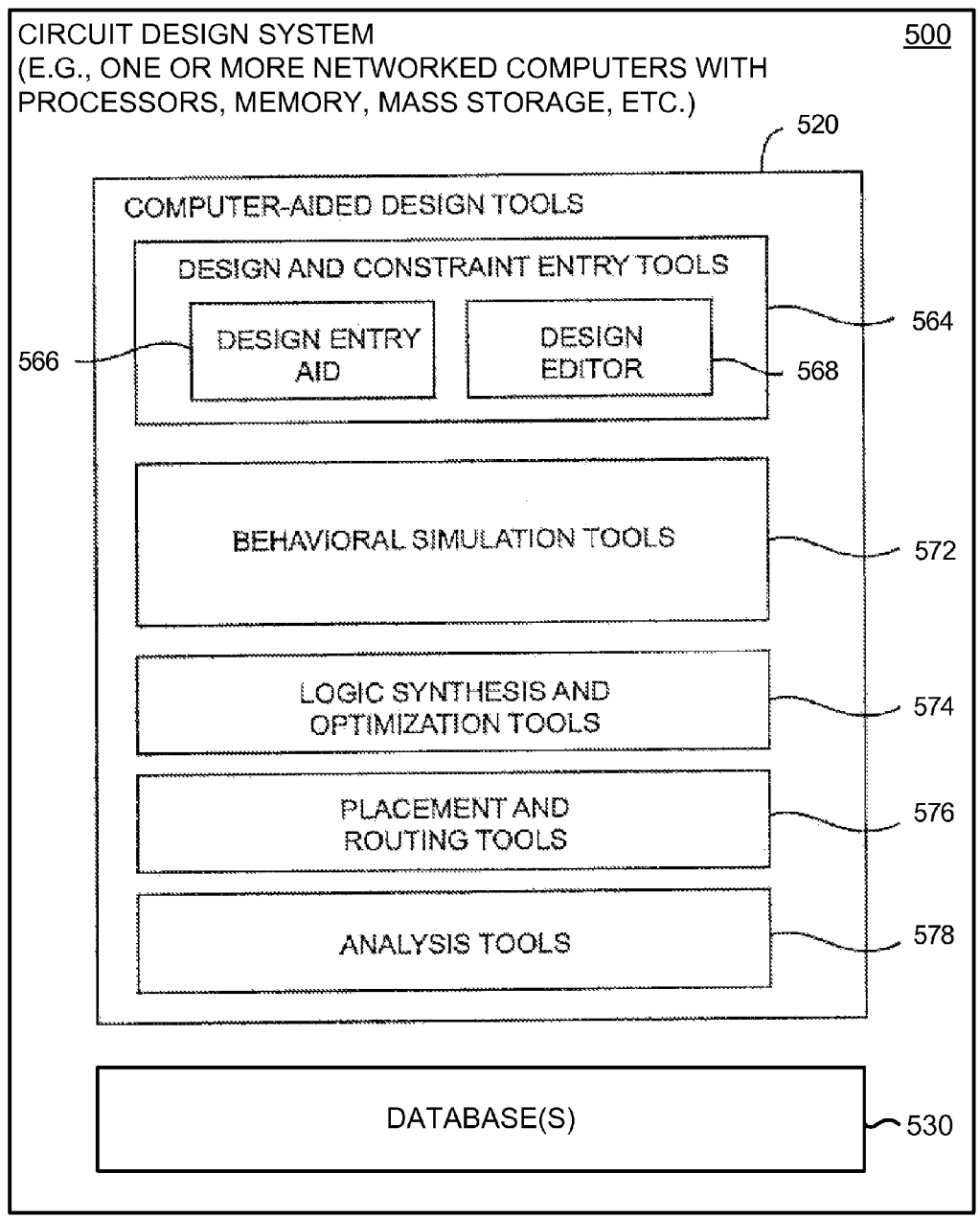
FIG. 5 is a diagram of an illustrative circuit design system with computer-aided design (CAD) tools and databases in accordance with an embodiment.

An illustrative circuit design system 500 in accordance with an embodiment is shown in FIG. 5. System 500 may be based on one or more processors such as personal computers, workstations, etc. The processor(s) may be linked using a network (e.g., a local or wide area network). Memory in these computers or external memory and storage devices such as internal and/or external hard disks may be used to store instructions and data.

Software-based components such as computer-aided design tools 520 and databases 530 reside on system 500. During operation, executable software such as the software of computer aided design tools 520 runs on the processor(s) of system 500. Databases 530 are used to store data for the operation of system 500. In general, software and data may be stored on any computer-readable medium (storage) in system 500. Such storage may include computer memory chips, removable and fixed media such as hard disk drives, flash memory, compact discs (CDs), digital versatile discs (DVDs), blu-ray discs (BDs), other optical media, and floppy diskettes, tapes, or any other suitable memory or storage device(s). When the software of system 500 is installed, the storage of system 500 has instructions and data that cause the computing equipment in system 500 to execute various methods (processes). When performing these processes, the computing equipment is configured to implement the functions of the circuit design system.

The computer aided design (CAD) tools 520, some or all of which are sometimes referred to collectively as a CAD tool or an electronic design automation (EDA) tool, may be provided by a single vendor or by multiple vendors. CAD tools 520 may be provided as one or more suites of tools (e.g., a compiler suite for performing tasks associated with implementing a circuit design in a programmable logic device) and/or as one or more separate software components (tools). Database(s) 530 may include one or more databases that are accessed only by a particular tool or tools and may include one or more shared databases. Shared databases may be accessed by multiple tools. For example, a first tool may store data for a second tool in a shared database. The second tool may access the shared database to retrieve the data stored by the first tool. This allows one tool to pass information to another tool. Tools may also pass information between each other without storing information in a shared database if desired.

Illustrative computer aided design tools 520 may execute a design process, which is sometimes also referred to as design compilation. The design process may start with the formulation of functional specifications of the integrated circuit design (e.g., a functional or behavioral description of the integrated circuit design). A circuit designer may specify the functional operation of a desired circuit design using design and constraint entry tools 564. Design and constraint entry tools 564 may include tools such as design and constraint entry aid 566 and design editor 568. Design and constraint entry aids such as aid 566 may be used to help a circuit designer locate a desired design from a library of existing circuit designs and may provide computer-aided assistance to the circuit designer for entering (specifying) the desired circuit design.

As an example, design and constraint entry aid 566 may be used to present screens of options for a user. The user may click on on-screen options to select whether the circuit being designed should have certain features. For example, the user may select whether the circuit being designed should include error code for error detection and correction.

Design editor 568 may be used to enter a design (e.g., by entering lines of hardware description language code), may be used to edit a design obtained from a library (e.g., using a design and constraint entry aid), or may assist a user in selecting and editing appropriate prepackaged code/designs.

Design and constraint entry tools 564 may be used to allow a circuit designer to provide a desired circuit design using any suitable format. For example, design and constraint entry tools 564 may include tools that allow the circuit designer to enter a circuit design using truth tables. Truth tables may be specified using text files or timing diagrams and may be imported from a library. Truth table circuit design and constraint entry may be used for a portion of a large circuit or for an entire circuit.

As another example, design and constraint entry tools 564 may include a schematic capture tool. A schematic capture tool may allow the circuit designer to visually construct integrated circuit designs from constituent parts such as logic gates and groups of logic gates. Libraries of preexisting integrated circuit designs may be used to allow a desired portion of a design to be imported with the schematic capture tools.

If desired, design and constraint entry tools 564 may allow the circuit designer to provide a circuit design to the circuit design system 500 using a hardware description language such as Verilog hardware description language (Verilog HDL), Very High Speed Integrated Circuit Hardware Description Language (VHDL), SystemVerilog, or a higher-level circuit description language such as OpenCL or SystemC, just to name a few. The designer of the integrated circuit design can enter the circuit design by writing hardware description language code with editor 568. Blocks of code may be imported from user-maintained or commercial libraries if desired.

After the design has been entered using design and constraint entry tools 564, behavioral simulation tools 572 may be used to simulate the functional performance of the circuit design. If the functional performance of the design is incomplete or incorrect, the circuit designer can make changes to the circuit design using design and constraint entry tools 564. The functional operation of the new circuit design may be verified using behavioral simulation tools 572 before synthesis operations have been performed using tools 574. Simulation tools such as behavioral simulation tools 572 may also be used at other stages in the design flow if desired (e.g., after logic synthesis). The output of the behavioral simulation tools 572 may be provided to the circuit designer in any suitable format (e.g., truth tables, timing diagrams, etc.).

Once the functional operation of the circuit design has been determined to be satisfactory, logic synthesis and optimization tools 574 may generate a gate-level netlist of the circuit design, for example using gates from a particular library pertaining to a targeted process supported by a foundry, which has been selected to produce the integrated circuit. Alternatively, logic synthesis and optimization tools 574 may generate a gate-level netlist of the circuit design using gates of a targeted programmable logic device (i.e., in the logic and interconnect resources of a particular programmable logic device product or product family).

Logic synthesis and optimization tools 574 may optimize the design by making appropriate selections of hardware to implement different logic functions in the circuit design based on the circuit design data and constraint data entered by the logic designer using tools 564. As an example, logic synthesis and optimization tools 574 may identify don't care bits in the design associated with satisfiability don't cares and observability don't cares (e.g., see FIG. 4).

If desired, logic synthesis and optimization tools 574 may modify the circuit design based on the identified don't care bits. In the example of FIG. 4 in which input C of 3-LUT 430 is an observability don't care, logic synthesis and optimization tool 574 may disconnect input C of 3-LUT 430 from input Z and tie input C of 3-LUT 430 to a constant value (e.g., logic "1"). As an example, consider that the look-up table of FIG. 2 implements 3-LUT 430. In this example, configuration memory cells 210, 212, 214, and 216 may store don't care bits in the event that input C of 3-LUT 430 is tied to logic "1"; and configuration memory cells 220, 222, 224, and 226 may store don't care bits in the event that input C of 3-LUT 430 is tied to logic "0". If desired, logic synthesis and optimization tools 574 may label don't care bits in the circuit design or assign don't care bits to a set of don't care bits.

In some embodiments, logic synthesis and optimization tools 574 may perform technology mapping. During technology mapping, logic synthesis and optimization tools 574 may map elements of the circuit design onto elements of a cell library that may be placed and routed. Such a cell library may include simple logic gates (e.g., logic AND gates, logic OR gates, logic INVERTER gates, logic NAND gates, logic XOR gates, etc.), look-up tables, registers, memory blocks, and/or other library cells.

As an example, consider the scenario in which a cell library includes a K-input LUT. In this scenario, logic synthesis and optimization tools 574 may map at least a portion of the circuit design elements to (K−1)-input LUTs and tie the K-th input of that LUT to a constant value (e.g., logic "0" or logic "1"), thereby generating $2^{(K-1)}$ don't care bits as shown in FIG. 2.

After logic synthesis and optimization using tools 574, the circuit design system may use tools such as placement and routing tools 576 to perform physical design steps (layout synthesis operations). Placement and routing tools 576 are used to determine where to place each gate of the gate-level netlist produced by tools 574. For example, if two counters interact with each other, the placement and routing tools 576 may locate these counters in adjacent regions to reduce interconnect delays or to satisfy timing requirements specifying the maximum permitted interconnect delay. The placement and routing tools 576 create orderly and efficient implementations of circuit designs for any targeted integrated circuit (e.g., for a given programmable integrated circuit such as a field-programmable gate array (FPGA).)

In some embodiments, placement and routing tools 576 may add resources to the circuit design which may include don't care bits for the circuit design. For example, placement and routing tools 576 may add dummy circuitry (e.g., one or more look-up tables) to the circuit design without connecting the dummy circuitry to other portions of the circuit design. If desired, placement and routing tools 576 may place the dummy circuitry together with the remaining circuit design. Placement and routing tools 576 may place the dummy circuitry in a predetermined restricted area of the integrated circuit that implements the circuit design, distributed across selected portions of the integrated circuit, distributed throughout the entire integrated circuit, or produce any combination of the above.

In some embodiments, CAD tools 520 may compile the circuit design targeting a limited amount of available resources. For example, CAD tools 520 may compile the circuit design for implementation on programmable logic device 100 of FIG. 1, which may have limited resources in terms of number of programmable logic regions 140 or interconnection resources 115, just to name a few. In this embodiment, placement and routing tools 576 may implement the circuit design using the limited resources of programmable logic device 100. If desired, placement and routing tools 576 may reserve existing resources for storing don't care bits and implement the circuit design using only non-reserved resources.

If desired, placement and routing tools 576 may label don't care bits in the circuit design or assign don't care bits to a set of don't care bits. For example, after placement and routing operations, placement and routing tools 576 may assign don't care bits of routing multiplexers (e.g., don't care bits of routing multiplexers 300 and 350 of FIGS. 3A and 3B) to a set of don't care bits.

Tools such as tools 574 and 576 may be part of a compiler suite (e.g., part of a suite of compiler tools provided by a programmable logic device vendor). In accordance with the present invention, tools such as tools 574, 576, and 578 may also include timing analysis tools such as timing estimators. This allows tools 574 and 576 to satisfy performance requirements (e.g., timing requirements) before actually producing the integrated circuit.

After an implementation of the desired circuit design has been generated using placement and routing tools 576, the implementation of the design may be analyzed and tested using analysis tools 578. For example, analysis tools 578 may include timing analysis tools, power analysis tools, or formal verification tools, just to name few.

After satisfactory optimization operations have been completed using CAD tools 520 and depending on the targeted integrated circuit technology, CAD tools 520 may produce a mask-level layout description of the integrated circuit or configuration data for programming the programmable logic device.

Figure 6:
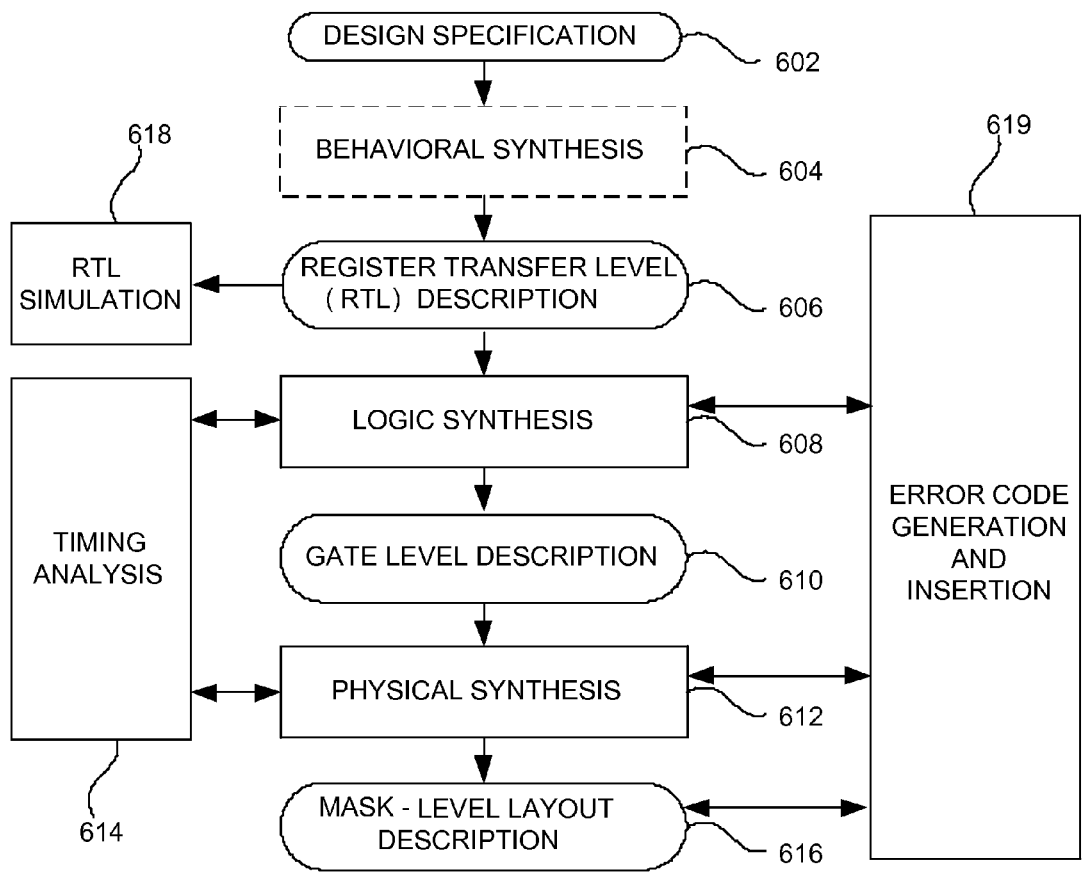
FIG. 6 is a flow chart of illustrative steps for designing an integrated circuit in accordance with an embodiment.

Illustrative operations involved in using CAD tools 520 of FIG. 5 to produce the mask-level layout description of the integrated circuit are shown in FIG. 6. As shown in FIG. 6, a circuit designer may first provide a design specification 602. The design specification 602 may, in general, be a behavioral description provided in the form of an application code (e.g., C code, C++ code, SystemC code, OpenCL code, etc.). In some scenarios, the circuit designer may provide the design specification in the form of a register transfer level (RTL) description 606.

The RTL description may have any form of describing circuit functions at the register transfer level. For example, the RTL description may be provided using a hardware description language such as the Verilog hardware description language (Verilog HDL or Verilog), the SystemVerilog hardware description language (SystemVerilog HDL or SystemVerilog), or the Very High Speed Integrated Circuit Hardware Description Language (VHDL). If desired, a portion or all of the RTL description may be provided as a schematic representation.

In general, the behavioral design specification 602 may include untimed or partially timed functional code (i.e., the application code does not describe cycle-by-cycle hardware behavior), whereas the RTL description 606 may include a fully timed design description that details the cycle-by-cycle behavior of the circuit at the register transfer level.

Design specification 602 or RTL description 606 may also include target criteria such as area use, power consumption, delay minimization, clock frequency optimization, or any combination thereof. The optimization constraints and target criteria may be collectively referred to as constraints.

Those constraints can be provided for individual data paths, portions of individual data paths, portions of a design, or for the entire design. For example, the constraints may be provided with the design specification 602, the RTL description 606 (e.g., as a pragma or as an assertion), in a constraint file, or through user input (e.g., using the design and constraint entry tools 564 of FIG. 5), to name a few.

Constraints included in design specification 602 or RTL description 606 may be conveyed to CAD tools 520 in the form of variables, parameters, compiler directives, macros, pragmas, or assertions, just to name a few. CAD tools 520 may use a constraint file, which may include a portion or all of the constraints. Such a constraint file may be included with design specification 602 or RTL description 606. In some scenarios, a portion or all of the constraints may be embedded in the circuit design. Alternatively, the constraints may have been defined using the design and constraint entry tools 564 (see FIG. 5).

At step 604, behavioral synthesis (sometimes also referred to as algorithmic synthesis) may be performed to convert the behavioral description into an RTL description 606. Step 604 may be skipped if the design specification is already provided in form of an RTL description.

At step 618, behavioral simulation tools 572 may perform an RTL simulation of the RTL description, which may verify the functional performance of the RTL description. If the functional performance of the RTL description is incomplete or incorrect, the circuit designer can make changes to the HDL code (as an example). During RTL simulation 618, actual results obtained from simulating the behavior of the RTL description may be compared with expected results.

During step 608, logic synthesis operations may generate gate-level description 610 using logic synthesis and optimization tools 574 from FIG. 5. If desired, logic synthesis operations may identify don't care bits in RTL description 606 and/or in the generated gate-level description 610 that are associated with satisfiability don't cares and observability don't cares (e.g., see FIG. 4). Logic synthesis operations may label the identified don't care bits or assign the identified don't care bits to a set of don't care bits.

During step 612, physical synthesis operations (e.g., place and route and optimization operations using for example placement and routing tools 576) may place and connect the different gates in gate-level description 610 in a preferred location on the targeted integrated circuit to meet given target criteria (e.g., minimize area and maximize routing efficiency or minimize path delay and maximize clock frequency or any combination thereof). The output of physical synthesis 612 is a mask-level layout description 616. In some embodiments, mask-level layout description 616 may include configuration data which may be embodied by a bitstream. The configuration data may configure at least a portion of a programmable integrated circuit such as PLD 100 of FIG. 1.

If desired, physical synthesis operations may add resources to gate-level description 610 with the goal of increasing the number of don't care bits. For example, physical synthesis operations may add dummy gates (e.g., one or more look-up tables) to the gate-level description 610 without connecting the dummy gates to other portions of the gate-level netlist. If desired, physical synthesis operations may place the dummy gates together with the remaining gate-level netlist. Physical synthesis operations may place the dummy gates in a predetermined restricted area of an integrated circuit, distributed across selected portions of the integrated circuit, distributed throughout the entire integrated circuit, or produce any combination of the above.

In some embodiments, physical synthesis 612 may target an integrated circuit with limited resources (e.g., PLD 100 of FIG. 1) and the physical synthesis operations may reserve some of the limited resources of the integrated circuit (e.g., by adding dummy gates to gate-level description 610 and/or by reducing the number of available resources of the integrated circuit). In some embodiments, physical synthesis operations may reserve a predetermined number of programmable logic regions 140 and/or a predetermined number of interconnection resources 115. Physical synthesis operations may use the reserved resources for storing don't care bits and implement gate-level description 610 using only non-reserved resources. If desired, physical synthesis operations may label don't care bits in the circuit design or assign don't care bits to a set of don't care bits.

Circuit design system 500 may include a timing estimator (e.g., formed as part of logic synthesis and optimization tools 574, placement and routing tools 576, or analysis tools 578) that may be used to estimate delays between synchronous elements of the circuit design during step 614. For example, timing estimator may estimate delays between sequential elements such as registers and storage circuits (e.g., based on the lengths of interconnects, intermediate combinational logic, etc.). The delays may, if desired, be estimated based on metrics such as slack (e.g., the difference between a required arrival time and the arrival time of a signal), slack-ratios, interconnect congestion, or other timing metrics. Circuit design system 500 may use the estimated delays to determine the locations of groups of circuitry while helping to ensure that delays satisfy timing requirements (e.g., critical path delay requirements) or other performance constraints.

Circuit design system 500 may include a tool (e.g., embedded in logic synthesis and optimization tools 574, in placement and routing tools 576, and/or in analysis tools 578) that may be used to perform error code generation and insertion. As shown, error code generation and insertion 619 may reserve don't care bits for the storage of error codes during logic synthesis 608 and/or physical synthesis 612. Error code generation and insertion 619 may generate error codes based on mask-level layout description 616. If desired, error code generation and insertion 619 may generate error codes based on gate-level description 610.

Error code generation and insertion 619 may generate error codes based on any error checking schemes. For example, error code generation and insertion 619 may generate parity bits for a multi-dimensional parity check (e.g., a two-dimensional parity check) or for a Hamming code, or checksum bits as a remainder of a polynomial division for a cyclic redundancy check (CRC), just to name a few.

A parity bit indicates whether the number of bits in a data word with the value logic "1" is odd or even. A parity bit may either indicate even parity or odd parity. For even parity, the parity bit has the value logic "1" if the number of bits in the data word with the value logic "1" is odd and the value logic "0" if the number of bits in the data word with the value logic "1" is either zero or even. In the case of odd parity, the parity bit has the value logic "0" if the number of bits in the data word with the value logic "1" is odd and the value logic "1" if the number of bits in the data word with the value logic "1" is either zero or even.

Parity bits checking for even parity may be generated using logic exclusive OR (XOR) gates. Parity bits checking for odd parity may be generated using XOR gates followed by an inverter. However, parity bits may not detect when an even number of errors occur in the transmitted data word. For example, a parity bit computed for a received data word has the same value as the parity bit computed before transmission of the data word if two bits of the data word change from logic "0" to logic "1". Furthermore, single parity bits cannot correct errors, because the position of the corrupted bit within the data word is unknown. However, the use of multiple parity bits arranged such that different corrupted bits within a data word produce different error results enables the detection of the position of a corrupted bit and thus enables error correction.

Figure 7:
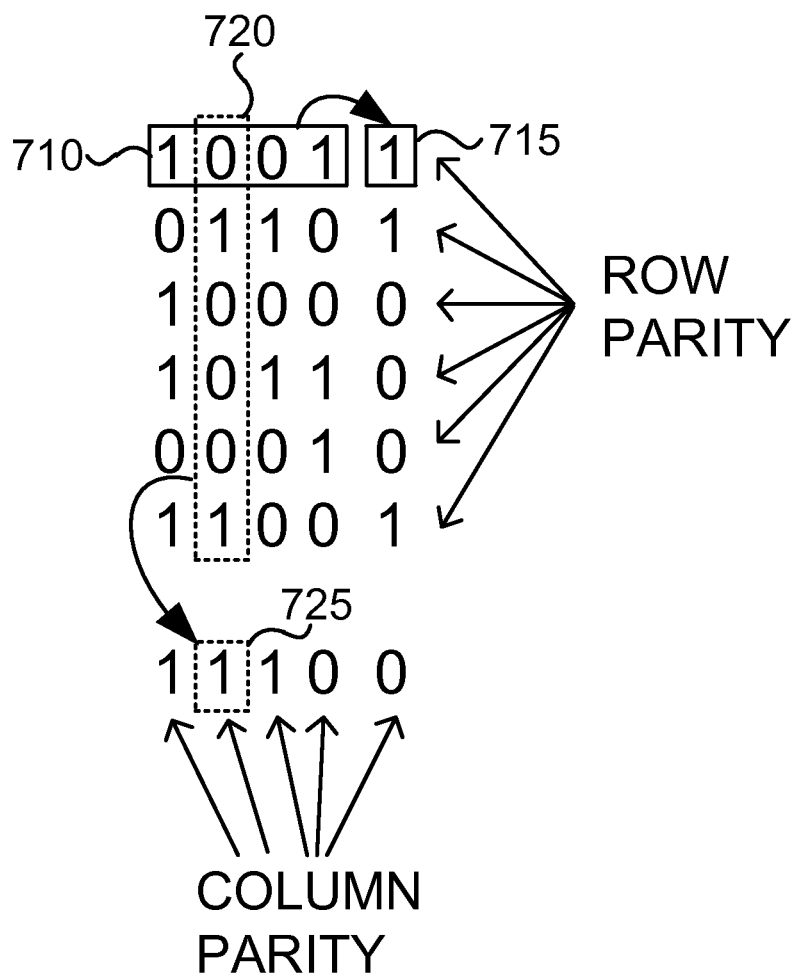
FIG. 7 is a diagram of an illustrative two-dimensional parity check code in accordance with an embodiment.

As an example, FIG. 7 shows error code generation for a two-dimensional array of bits based on a two-dimensional parity check code (2DPCC) that enables the detection of the position of a corrupted bit and thus enables error correction.

As shown, the two-dimensional array may have six rows including row 710 and four columns including column 720. An error code generator may generate a row parity bit for each of the six rows and a column parity bit for each of the four columns. If desired, the error code generator may generate an additional column parity bit for the row parity bits. Alternatively, the error code generator may generate an additional row parity bit for the column parity bits.

The error code generator may generate even parity bits for row parity and column parity, odd parity bits for row parity and even parity bits for column parity, or even parity bits for row parity and odd parity bits for column parity. As shown, the error code generator may generate odd parity bits for row parity and for column parity. For example, row 710 includes an even number of bits with the value logic "1". Thus, row parity bit 715 has the value logic "1". As another example, column 720 includes an even number of bits with the value logic "1", which implies that column parity bit 725 has the value logic "1". The error code generator may store the generated parity bits in memory.

An error code checker may access the memory to retrieve the stored parity bits for the purpose of error detection and error correction. The error code checker may compute row parity bits and column parity bits and compare the computed row parity and column parity bits with the stored parity bits. A mismatch in a comparison of a computed row parity bit with a stored row parity bit may indicate an error in the corresponding row. A mismatch in a comparison of a computed column parity bit with a stored column parity bit may indicate an error in the corresponding column. Detecting an error in a row and an error in a column may indicate an error in the bit at the intersection of the row and the column. If desired, the error code checker may correct the detected error by inverting the value of the detected bit.

As an example, consider the scenario in which the bit values of two-dimensional array of bits of FIG. 7 and the row and column parity bits of the two-dimensional array of bits are stored in memory such as configuration memory cells or in registers. Consider further that a single event upset (SEU) strikes the memory that stores the bit at the intersection of row 710 and column 720 and changes the value of that bit from logic "0" to logic "1". In this scenario, an error code checker may compute odd parity of row 710 and determine that row parity bit 715 has the value logic "0". The error code checker may further compute odd parity of column 720 and determine that column parity bit 725 has the value logic "0". The error code checker may perform a comparison with the corresponding parity bits stored in memory and detect an error at the intersection of row 710 and column 720. If desired, the error code checker may correct the detected error at the intersection of row 710 and column 720 by changing the value of the bit from logic "1" to logic "0".

Figure 8:
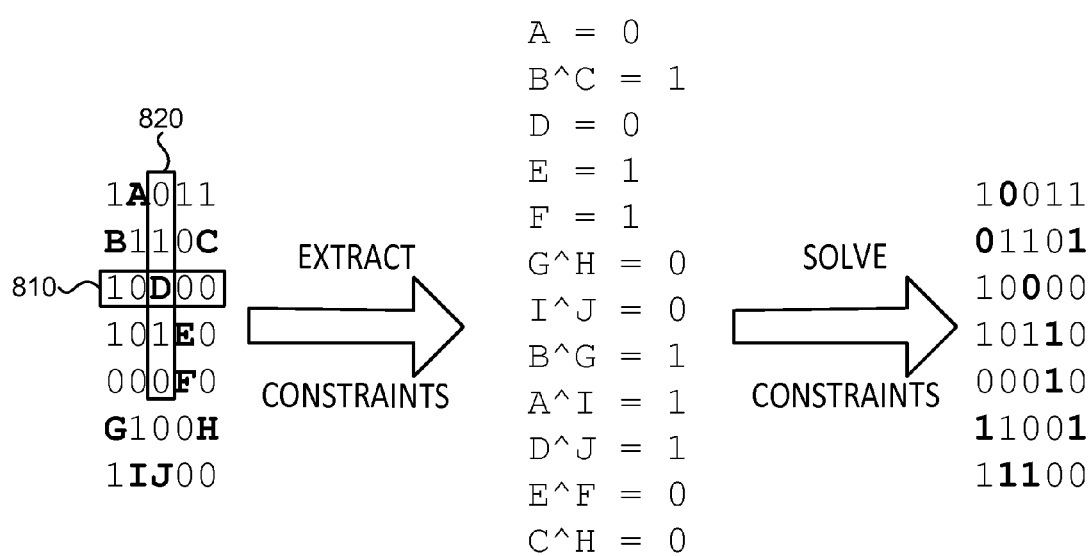
FIG. 8 is a diagram of an illustrative process for using don't care bits to generate error code in accordance with an embodiment.

In some embodiments, the error code (e.g., the row and columns parity bits) may be stored in don't care memory cells. FIG. 8 is a diagram of an illustrative process for using don't care bits to generate and store an error code in don't care memory cells of a two-dimensional memory cell array in accordance with an embodiment.

As shown, the two-dimensional memory cell array may have seven rows and five columns. The two-dimensional memory cell array may store don't care bits A, B, C, D, E, F, G, H, I, and J. An error code generator may generate odd parity for each of the seven rows and for each of the five columns based on the don't care bits. For this purpose, the error code generator may extract constraints for the don't care bits based on the parity of the bit values stored in each of the rows and in each of the columns.

For example, the error code generator may determine that A and D have to have the value logic "0" (i.e., A=0, D=0) for odd parity of rows one and three, E and F have to have the value logic "1" for odd parity of rows four and five, exactly one of B or C have to have the value logic "1" (i.e., B XOR C=1) for odd parity of row two, both of G and H have to have the same logic value (i.e., G XOR H=0) for odd parity of row six, and both of I and J have to have the same logic value (i.e., I XOR J=0) for odd parity of row seven.

Similarly, the error code generator may determine that exactly one of B and G, exactly one of A and I, and exactly one of D and J have to have the value logic "1" (i.e., B XOR G=1, A XOR I=1, D XOR J=1) for odd parity of columns one, two, and three, respectively. The error code generator may further determine that E and F and that C and H have to have the same logic value (i.e., E XOR F=0, C XOR H=0) for odd parity of columns four and five, respectively.

The constraints represent a system of linear equations modulo 2, which the error code generator may solve to determine the parity bits. For example, since A must have the value logic "1" and A XOR I the value logic "1", I must have the value logic "0". Furthermore, J must have the value logic "0", because of the constraints I XOR J=0 and D XOR J=1.

B, C, G, and H may have two different solutions, and the error code generator may arbitrarily choose a value for one of the variables when multiple solutions for a variable are possible. For example, the error code generator may choose B to have the value logic "1". In this example, C must have the value logic "0" (because of the constraint B XOR C=0), H must have the value logic "0" (because of the constraint C XOR H=0), and G must have the value logic "0" (because of the constraint G XOR H=0). In another example, the error code generator may choose B to have the value logic "0". In this example, C must have the value logic "1", H the value logic "1", and G the value logic "1".

The error code generator may store the values obtained by solving the system of linear equations (i.e., values logic "0", logic "0", logic "1", logic "0", logic "1", logic "1", logic "1", logic "1", logic "1", and logic "1") in the don't care memory cells with don't care bits A, B, C, D, E, F, G, H, I, J, respectively.

In some embodiments, the system of linear equations that uses row and column parity may not have a solution. For example, consider the scenario in which parity is computed for rows that include five columns (e.g., row 810) and for columns that include five rows (e.g., column 820). In this scenario, the error code generator may extract the constraint that D must have the value logic "0" for row 810 and the constraint that D must have the value logic "1" for column 820. Thus, there is no valid solution for D that satisfies these constraints.

The problem of unsatisfiable constraints may be overcome by adding more rows and/or columns such that more don't care bits are part of each parity computation. For example, extending each column such as column 820 to include seven rows leads to a valid solution as shown above. In some embodiments, an additional don't care bit may be added to a subset with unsatisfiable constraints such that the constraints become solvable. For example, adding a don't care bit K with value logic "1" to column 820 may enable D to have the value logic "0", which satisfies the constraint for row 810.

In some embodiments, the error code generator may generate error code for rows but not for columns or for columns but not for rows. In such an embodiment, the error code may provide for error detection, because computing two different parity bit values for the same row or column may indicate that an error has occurred in that row or column. However, the error code may not provide for error correction, because the error can no longer be located.

In some embodiments, the error code generator may generate error code for all but a few rows and/or columns. If desired, the error code generator may label the rows and/or columns for which no error code was generated. In the example above, the error code generator may select the value logic "0" for D such that row 810 has odd parity and label column 820 as not having odd parity.

Computing row and column parity is merely illustrative and is not intended to limit the scope of the present invention. If desired, the error code generator may partition the set of bits for which error code is generated in any arbitrary number of subsets such that any two subsets may identify a unique bit in the set of bits. In other words, each bit of the set of bits may be in two subsets and no two bits may be in the same two subsets.

If desired, the error code generator may include bits from different locations of the integrated circuit into each subset to decrease the probability that more than one bit in the subset may be corrupted by a single event upset (SEU), which may occur in one locality on the integrated circuit.

In some embodiments, the error code generator may partition the set of bits into subsets such that the subsets include one or more unique don't care bits. Having unique don't care bits in the subsets may facilitate the extraction and solving of constraints.

An error code checker may access the don't care memory cells to retrieve the stored parity bits for the purpose of error detection and error correction. The error code checker may compute parity bits and compare the computed parity bits with the stored parity bits. A mismatch in a comparison of a computed parity bit with a stored parity bit may indicate an error in the corresponding subset of bits. Finding two mismatches in two different subsets of bits that share a common bit may indicate that the corresponding bit value has been corrupted (e.g., by a single-event upset). If desired, the error code checker may correct the detected error by inverting the value of the corresponding bit.

Figure 9:
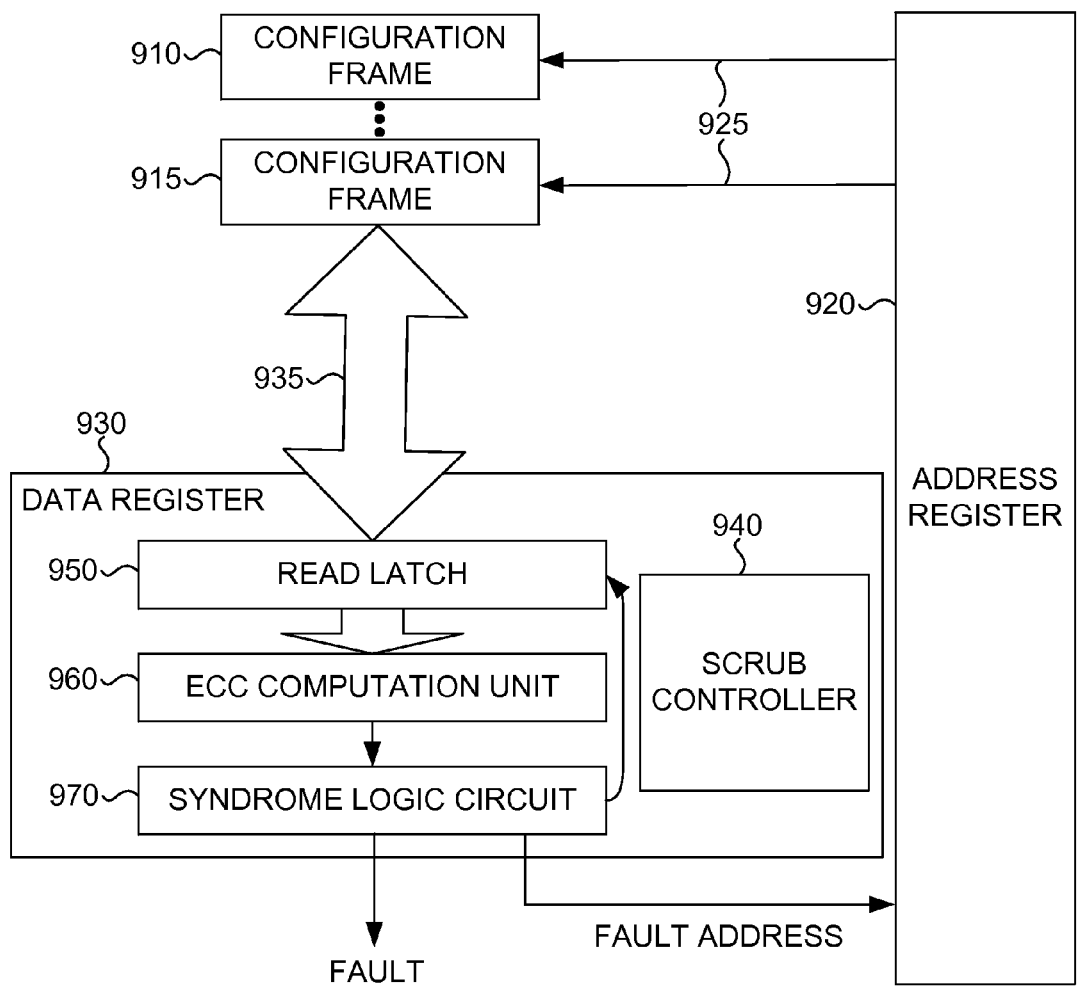
FIG. 9 is a diagram of an illustrative error detection and correction circuit in accordance with an embodiment.

The error code checker may perform error checks to detect and correct errors at periodic time intervals or on demand. FIG. 9 is a diagram of an illustrative error detection and correction circuit that may detect and correct errors in a configuration frame (e.g., a set of configuration memory cells in PLD 100 of FIG. 1).

As shown, configuration frames such as configuration frames 910 and 915 may each include a set of configuration memory cells (e.g., the two-dimensional memory cell array with don't care memory cells A to J storing parity bits obtained by extracting and solving constraints as shown in FIG. 8). Address register 920 and data register 930 may coordinate read and write access to the configuration frames. For example, address register 920 may enable access to configuration frame 910 through address lines 925, thereby connecting configuration frame 910 through bits lines 935 to data register 930. For the purpose of error checking, data register 930 may access the configuration memory cells of configuration frame 910 in a read operation.

Data register 930 may include read latch 950, ECC computation unit 960, syndrome logic circuitry 970, and scrub controller 940. As a result of the read operation, read latch 950 may receive the values stored in the configuration memory cells of configuration frame 910. ECC computation unit 960 may compute the syndrome. As an example, ECC computation unit may compute the parity bits for each subset of bits of configuration frame 910 and compare the computed parity bits (e.g., obtained by extracting and solving constraints as shown in FIG. 8) with the parity bits retrieved from the parity bits stored in the don't care configuration memory cells (e.g., in don't care memory cells A to J of FIG. 8) of configuration frame 910 to compute the syndrome.

Syndrome logic circuit 970 may receive the syndrome from ECC computation unit 960. If the received syndrome is zero, syndrome logic circuit 970 may consider that no error has been detected. If the received syndrome is non-zero, syndrome logic circuit 970 may detect that an error has been detected. As a result, syndrome logic circuit 970 may notify a user of the error through signal FAULT.

If desired, syndrome logic circuit 970 may produce an error location (e.g., an address and a bit location) associated with the detected error and communicate the error location to address register 920 and read latch 950. Scrub controller 940 may control the write access to configuration frame 910 through bit lines 935 for the purpose of correcting the located error in configuration frame 910.

Figure 10:
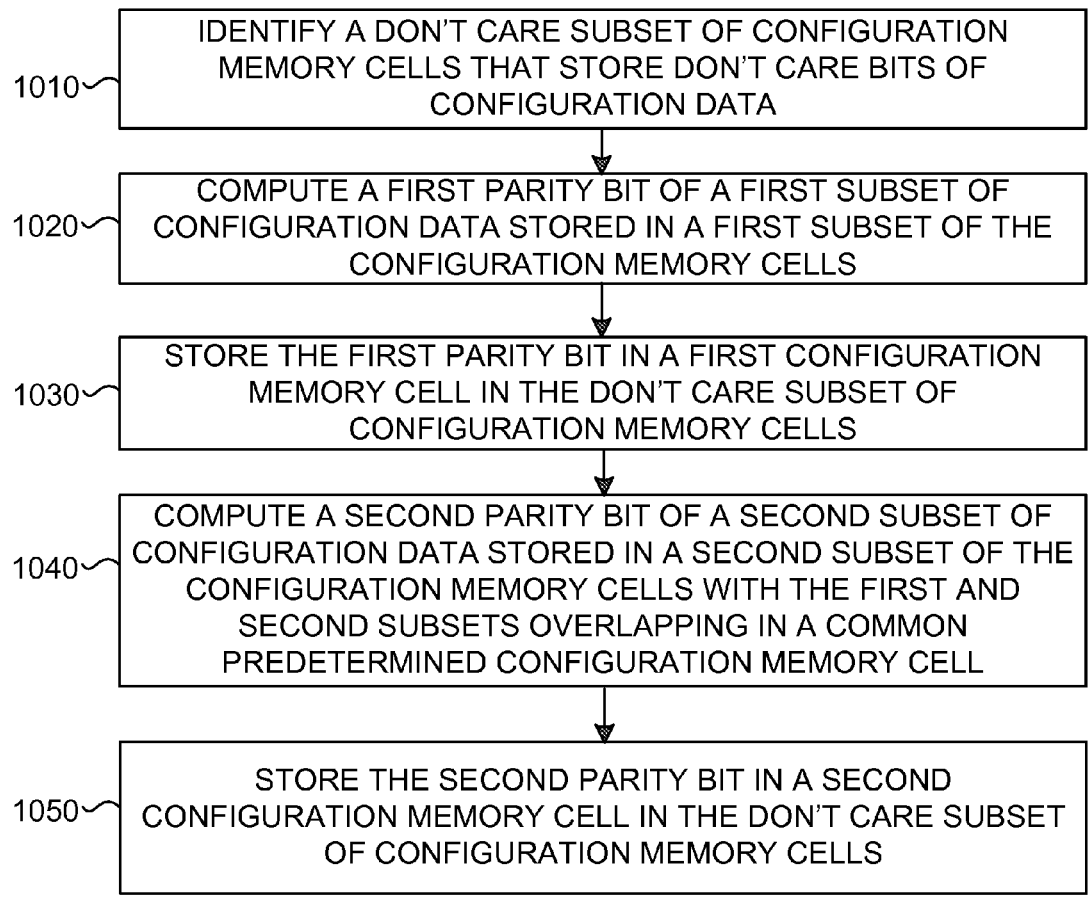
FIG. 10 is a flow char of illustrative steps for processing configuration data that is stored in configuration memory cells on a programmable integrated circuit and for implementing a circuit design on the programmable integrated circuit in accordance with an embodiment.

FIG. 10 is a flow chart of illustrative steps that an error code generator may perform when processing configuration data that is stored in configuration memory cells on a programmable integrated circuit. During step 1010, the error code generator may identify a don't care subset of configuration memory cells that store don't care bits of configuration data. For example, the error code generator may identify don't care bits A, B, C, D, E, F, G, I, and J of the two-dimensional memory cell array of FIG. 8.

During step 1020, the error code generator may compute a first parity bit of a first subset of configuration data stored in a first subset of the configuration memory cells. For example the error code generator may compute a parity bit of value logic "0" for the first row of the two-dimensional memory cell array of FIG. 8 based on don't care bit A. During step 1030, the error code generator may store the first parity bit in a first configuration memory cell in the don't care subset of configuration memory cells. For example, the error code generator may replace don't care bit A with the parity bit having the value logic "0".

During step 1040, the error code generator may compute a second parity bit of a second subset of configuration data stored in a second subset of the configuration memory cells with the first and second subsets overlapping in a common predetermined configuration memory cell. For example, assuming that the don't care bit B has already been determined to store the value logic "0", the error code generator may compute a parity bit of value logic "1" for the first column of the two-dimensional memory cell array of FIG. 8 based on don't care bit G.

During step 1050, the error code generator may store the second parity bit in a second configuration memory cell in the don't care subset of configuration memory cells. For example, the error code generator may replace don't care bit G with the value logic "1".

Figure 11:
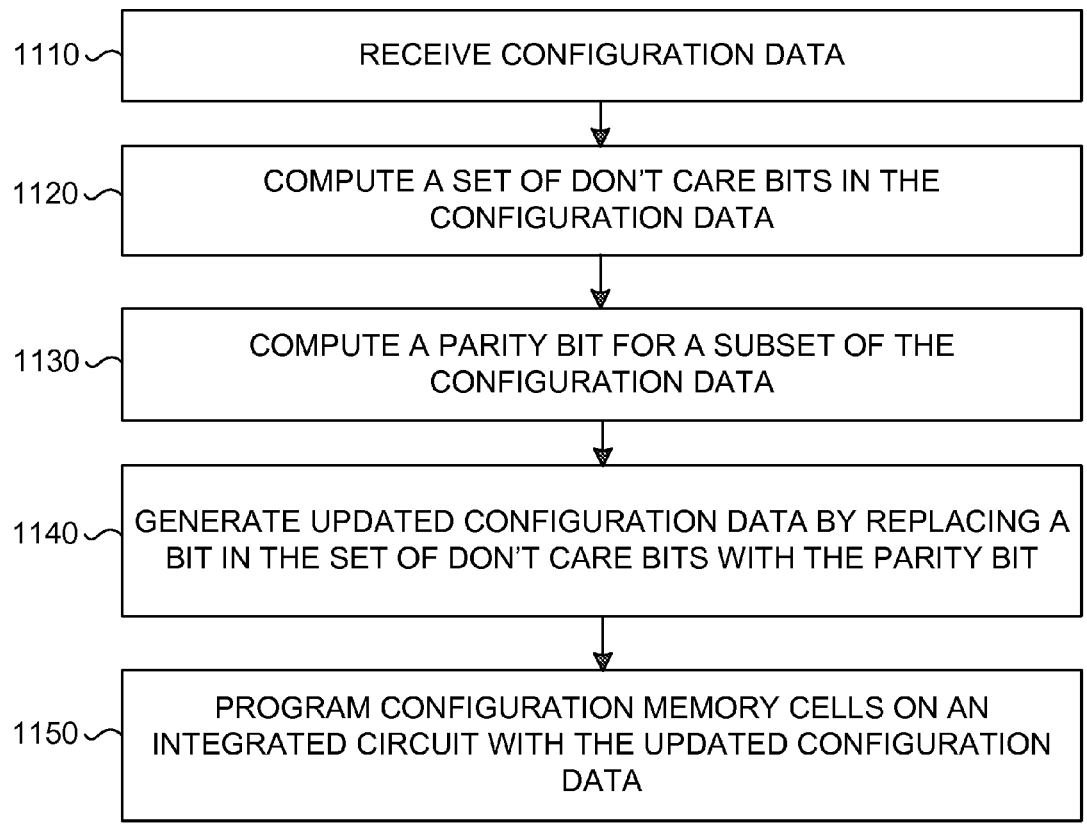
FIG. 11 is a flow chart of illustrative steps for processing configuration data that implements a circuit design on an integrated circuit in accordance with an embodiment.

FIG. 11 is a flow chart of illustrative steps that a CAD tool may perform for processing configuration data that implements a circuit design on an integrated circuit in accordance with an embodiment. As an example, CAD tools 520 of FIG. 5 may perform error code generation and insertion such as error code generation and insertion 619 of FIG. 6. During step 1110, the CAD tool may receive configuration data. For example, the CAD tool may receive configuration data as part of mask-level layout description 616 of FIG. 6.

During step 1120, the CAD tool may compute a set of don't care bits in the configuration data. During step 1130, the CAD tool may compute a parity bit for a subset of the configuration data. During step 1140, the CAD tool may generate updated configuration data by replacing a bit in the set of don't care bits with the parity bit.

During step 1150, the CAD tool may program configuration memory cells on an integrated circuit with the updated configuration data. For example, the CAD tool may configure the programmable logic regions 140 in PLD 100 of FIG. 1 by loading the updated configuration data into memory elements 130 using pins 120 and input/output circuitry 110.

Figure 12:
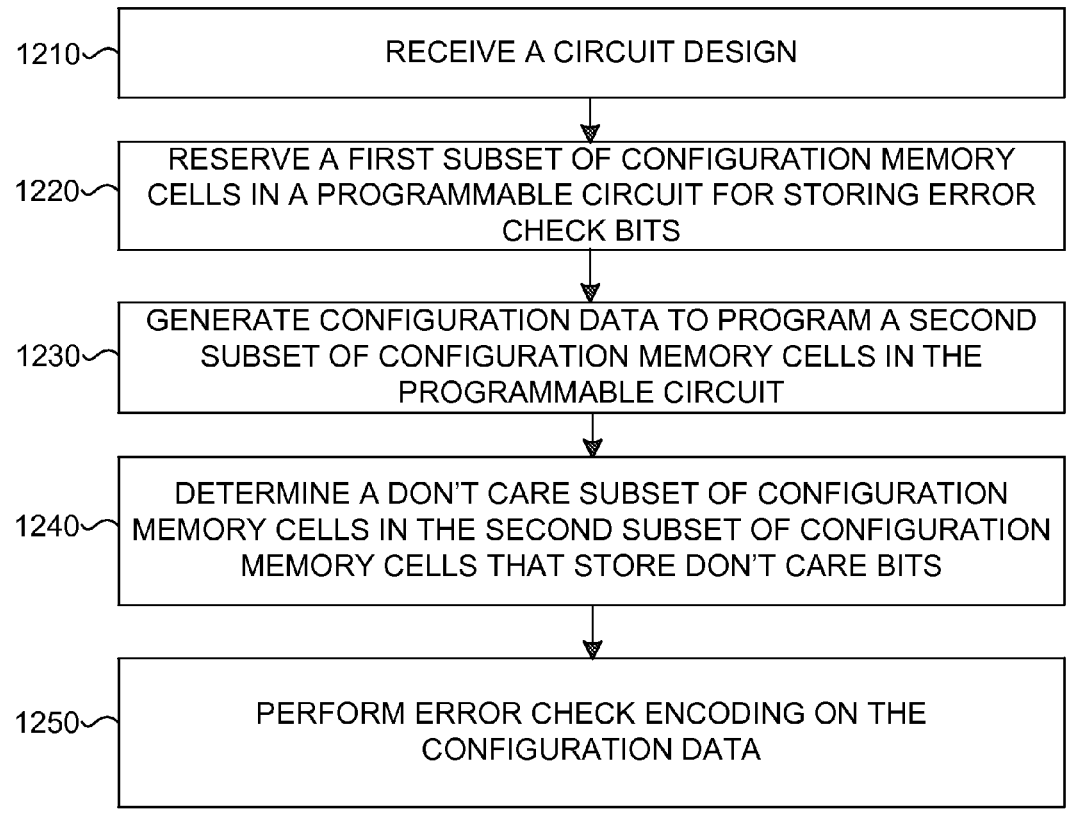
FIG. 12 is a flow chart of illustrative steps for processing a circuit design for implementation on a programmable circuit in accordance with an embodiment.

FIG. 12 is a flow chart of illustrative steps that a circuit design system such as circuit design system 500 of FIG. 5 may perform for processing a circuit design for implementation on a programmable circuit in accordance with an embodiment. During step 1210, the circuit design system may receive a circuit design (e.g., using design and constraint entry tools 564 of FIG. 5). During step 1220, the circuit design system may reserve a first subset of configuration memory cells in a programmable circuit for storing error check bits. For example, the circuit design system may reserve configuration memory cells when executing logic synthesis and optimization tools 574 and/or placement and routing tools 576 of FIG. 5.

During step 1230, the circuit design system may generate configuration data to program a second subset of configuration memory cells in the programmable circuit. During step 1240, the circuit design system may determine a don't care subset of configuration memory cells in the second subset of configuration memory cells that store don't care bits. During step 1250, the circuit design system may perform error check encoding on the configuration data.

The method and apparatus described herein may be incorporated into any suitable electronic device or system of electronic devices. For example, the method and apparatus may be incorporated into numerous types of devices such as microprocessors or other ICs. Exemplary ICs include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), digital signal processors (DSPs), graphics processing units (GPUs), just to name a few.

The integrated circuit described herein may be part of a data processing system that includes one or more of the following components; a processor; memory; I/O circuitry; and peripheral devices. The integrated circuit can be used in a wide variety of applications, such as computer networking, data networking, instrumentation, video processing, digital signal processing, or any suitable other application where the advantage of using integrated circuits with error detection and/or error correction circuitry is desirable.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:

1. A method for processing configuration data that is stored in configuration memory cells on a programmable integrated circuit and for implementing a circuit design on the programmable integrated circuit, comprising:
    identifying a don't care subset of the configuration memory cells that store don't care bits of the configuration data, wherein a polarity change in one of the don't care bits preserves the functionality of the circuit design implementation in the programmable integrated circuit;
    computing a first error check bit of a first subset of the configuration data stored in a first subset of the configuration memory cells; and
    storing the first error check bit in a first configuration memory cell in the don't care subset of configuration memory cells.

2. The method of claim 1, wherein the configuration memory cells comprise an array of configuration memory cells arranged in rows and columns, and wherein the first subset of the configuration data is stored in a row of configuration memory cells in the array.

3. The method of claim 1, further comprising:
    computing a second error check bit of a second subset of the configuration data stored in a second subset of the configuration memory cells, wherein the first and second subsets of the configuration memory cells overlap in a common predetermined configuration memory cell.

4. The method of claim 3, wherein the second subset of the configuration data is stored in a column of configuration memory cells in the array.

5. The method of claim 3, further comprising:
storing the second error check bit in a second configuration memory cell in the don't care subset of configuration memory cells.

6. The method of claim 5, further comprising:
associating a first location with the first configuration memory cell; and
selecting a second location for the second configuration memory cell, wherein the second location has a predetermined distance from the first location.

7. The method of claim 5, further comprising:
computing a third error check bit of the first subset of configuration data stored in the first subset of configuration memory cells; and
detecting a mismatch between the first and third error check bits that is indicative of an error in the first subset of configuration data by comparing the first and third error check bits.

8. The method of claim 7, further comprising:
computing a fourth error check bit of the second subset of configuration data stored in the second subset of configuration memory cells; and
detecting a mismatch between the second and fourth error check bits that is indicative of an error in the second subset of configuration data by comparing the second and fourth error check bits.

9. The method of claim 8, further comprising:
in response to detecting the mismatch between the first and third error check bits and the mismatch between the second and fourth error check bits, inverting the value of the configuration data stored in the common predetermined configuration memory cell.

10. The method of claim 1, wherein identifying the don't care subset of configuration memory cells further comprises:
adding configuration memory cells that are unused by the circuit design implementation to the don't care subset of configuration memory cells.

11. The method of claim 1, wherein identifying the don't care subset of configuration memory cells further comprises:
identifying a second subset of configuration memory cells, wherein a configuration memory cell in the second subset stores a bit of the configuration data that has a high logic value; and
identifying a third subset of configuration memory cells, wherein a configuration memory cell in the third subset stores a bit of the configuration data that has a low logic value.

12. The method of claim 11, further comprising:
subtracting the second and third subsets of configuration memory cells from the configuration memory cells to determine the don't care subset of configuration memory cells.

13. A method for processing configuration data that implements a circuit design on an integrated circuit, comprising:
receiving the configuration data;
identifying a set of don't care bits in the configuration data, wherein a polarity change in any one of the don't care bits preserves the functionality of the circuit design;
computing a parity bit for a subset of the configuration data;
generating updated configuration data by replacing a bit in the set of don't care bits with the parity bit; and
programming configuration memory cells on the integrated circuit with the updated configuration data.

14. The method of claim 13, wherein generating the updated configuration data further comprises:
computing an additional parity bit for an additional subset of the configuration data, wherein the subset and the additional subset of the configuration data share a common bit.

15. The method of claim 14, further comprising:
replacing an additional bit in the set of don't care bits with the additional parity bit.

16. The method of claim 15, further comprising:
computing first parity of the subset of the configuration data;
computing second parity of the additional subset of the configuration data; and
comparing the computed first parity with the parity bit and the computed second parity with the additional parity bit to identify a bit error of the common bit.

17. The method of claim 16, further comprising:
in response to identifying that the common bit is erroneous, correcting the erroneous bit by inverting the common bit.

18. The method of claim 13, wherein computing the parity bit for the subset of the configuration data further comprises:
generating a constraint for the bit that the set of don't care bits and the subset of the configuration data have in common.

19. A non-transitory computer-readable storage medium for processing a circuit design for implementation on a programmable circuit, comprising instructions for:
receiving the circuit design;
reserving a first subset of configuration memory cells in the programmable circuit for storing error check bits;
generating configuration data to program a second subset of configuration memory cells in the programmable circuit, wherein the configuration data implements the circuit design in the programmable circuit, and wherein the first and second subsets are disjoint;
identifying a don't care subset of configuration memory cells in the second subset of configuration memory cells that store don't care bits, wherein a polarity change in the don't care bits preserves the functionality of the circuit design implementation in the programmable circuit; and
performing error check encoding on the configuration data.

20. The non-transitory computer-readable storage medium of claim 19, wherein performing the error check encoding further comprises:
adding configuration memory cells from the don't care subset to the first subset of configuration memory cells;
computing the error check bits in the configuration data; and
storing the error check bits in the first subset of configuration memory cells.

21. The non-transitory computer-readable storage medium of claim 20, wherein computing the error check bits further comprises:
computing a first parity bit for a first subset of configuration data; and
computing a second parity bit for a second subset of configuration data, wherein the first and second subsets of configuration data have a common bit.

22. The non-transitory computer-readable storage medium of claim 19, wherein reserving the first subset of configuration memory cells further comprises:

reserving configuration memory cells of a look-up table in the programmable circuit by blocking an input to the look-up table.

23. The non-transitory computer-readable storage medium of claim 22, wherein generating configuration data further comprises:

removing configuration memory cells from the first subset by un-blocking the input to the look-up table.

24. The non-transitory computer-readable storage medium of claim 19, wherein reserving the first subset of configuration memory cells further comprises:

reserving configuration memory cells of a configurable routing multiplexer in the programmable circuit by blocking an output of the configurable routing multiplexer.

25. The non-transitory computer-readable storage medium of claim 24, wherein generating configuration data further comprises:

removing configuration memory cells from the first subset by un-blocking the output of the configurable routing multiplexer.

\* \* \* \* \*